United States Patent [19]

Mito et al.

[11] Patent Number: 5,070,027
[45] Date of Patent: Dec. 3, 1991

[54] METHOD OF FORMING A HETEROSTRUCTURE DIODE

[75] Inventors: Yoshio Mito, Minoo; Masatoshi Kitagawa, Hirakata; Takashi Hirao, Moriguchi; Yoshitake Yasuno, Kyoto; Ryuma Hirano, Hirakata, all of Japan

[73] Assignee: Matsushita Electric Industrial Co., Ltd., Osaka, Japan

[21] Appl. No.: 483,872

[22] Filed: Feb. 23, 1990

[30] Foreign Application Priority Data

Feb. 23, 1989 [JP] Japan .................................. 1-43706
Feb. 23, 1989 [JP] Japan .................................. 1-43707
Mar. 30, 1989 [JP] Japan .................................. 1-80347

[51] Int. Cl.$^5$ ........................................... H01L 21/04
[52] U.S. Cl. ............................ 437/15; 437/101; 437/100; 437/3; 437/904
[58] Field of Search ................ 357/30 K, 2; 437/100, 437/101, 2, 904, 4, 83, 247, 3, 15; 148/DIG. 72, DIG. 3, DIG. 1

[56] References Cited

U.S. PATENT DOCUMENTS

| 4,362,766 | 12/1982 | Dannhäuser et al. | 437/100 |
| 4,569,697 | 2/1986 | Tsu et al. | 437/101 |
| 4,692,782 | 9/1987 | Seki et al. | 357/29 |
| 4,768,072 | 8/1988 | Seki et al. | 357/30 K |

FOREIGN PATENT DOCUMENTS

| 0107574 | 6/1984 | Japan | 437/101 |
| 0048014 | 3/1987 | Japan | 148/1 |
| 0050572 | 2/1989 | Japan | 357/29 |
| 0150573 | 2/1989 | Japan | . |
| 0081276 | 3/1989 | Japan | 357/29 |
| 0098268 | 4/1989 | Japan | 357/29 |

OTHER PUBLICATIONS

Silicon Heterojunction Bipolar Transistors with Amorphous-, Symons et al., Solid-State Elec., vol. 30, No. 11, pp. 1143-1145, 1987.
On the Influence of Hydrogen on the Transport Properties of Amor. Si., Miller and Kalbitzer, 1977, pp. 347-351.

Primary Examiner—Brian E. Hearn
Assistant Examiner—Michael Trinh
Attorney, Agent, or Firm—Stevens, Davis, Miller & Mosher

[57] ABSTRACT

A heterostructure diode is produced by a plasma CVD process. A defect caused on a silicon single crystal substrate by plasma deposition during formation of an amorphous semiconductor film leads to a problem of increase in the dark current due to the defect level. This defect is compensated for by active hydrogen contained in the amorphous semiconductor film so as to reduce the dark current. This can be effected by an annealing process conducted after formation of the heterojunction diode. The RF power is set low in the beginning period of formation of the semiconductor film. A radiation detecting apparatus is provided in which a plurality of the heterostructure diodes are integrated on a common substrate.

5 Claims, 8 Drawing Sheets

F I G. 5A 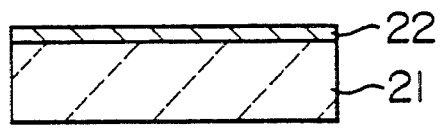
F I G. 5B 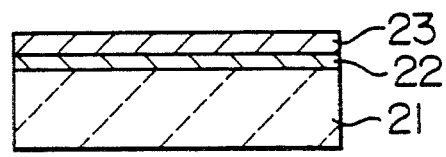
F I G. 5C 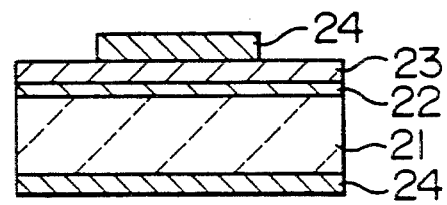
F I G. 6
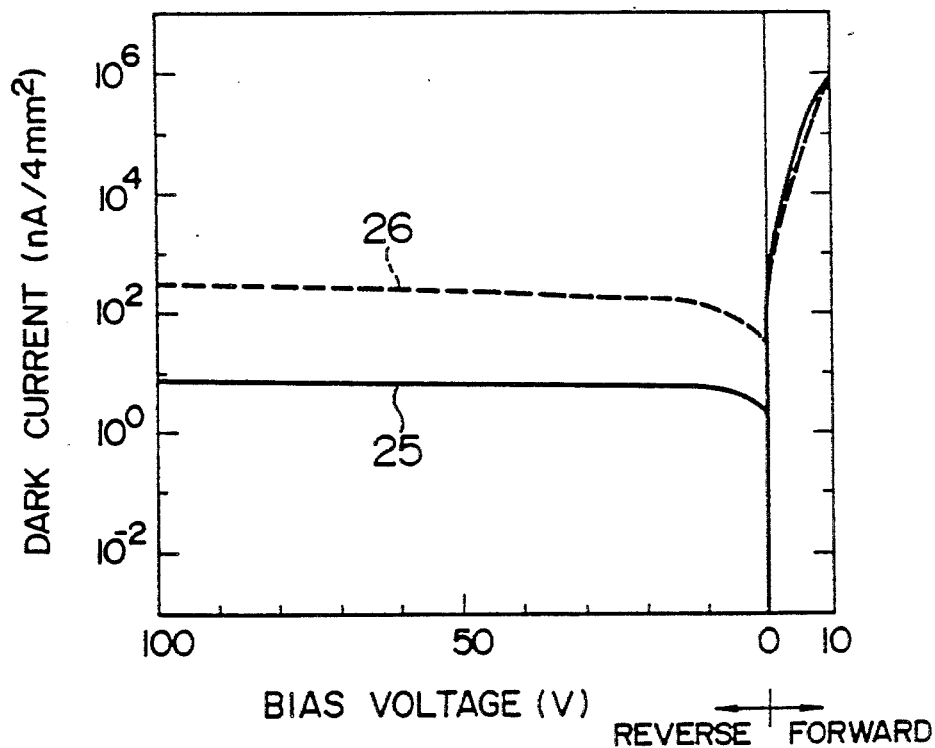

METHOD OF FORMING A HETEROSTRUCTURE DIODE

BACKGROUND OF THE INVENTION

The present invention relates to a heterostructure element, and particularly to a heterostructure diode used in apparatus for detecting light rays, radioactive rays and the like.

Further, the present invention relates to an apparatus for detecting light rays, radioactive rays and the like in which the above-mentioned diode is used.

PRIOR ART OF THE INVENTION

Conventionally, photoelectric apparatus incorporating heterostructure elements using semiconductors have been widely available for converting radiation such as visible light rays, infrared rays, radioactive rays or the like into electrical signals. These heterostructure elements have been mainly pn (pin) junction diodes which provide a depletion layer serving as a sensitive layer when an reverse bias voltage is applied thereto.

During a manufacturing process, a pn junction diode is subjected to treatment at a high temperature of about 900 deg. C. which results in thermally induced defects and ion implantation which causes substrate damage substrate. These defects and damage cannot be cured completely even by an annealing treatment. Accordingly, the conventional pn junction diodes have suffered from a low S/N ratio due to high dark current generated by recombination of ions.

Accordingly, an attempt has been recently made in which an amorphous silicon carbide film is built up on a silicon single crystal substrate at a relatively low temperature of 200 to 300 dec. C. by use of a radio-frequency (RF) or d.c. plasma CVD process so as to form a heterostructure lamination, and thereafter, on both surfaces of the thus obtained lamination are laid ohmic electrodes such as aluminum electrodes so as to obtain a heterostructure diode, thereby reducing induced defects while lowering dark current.

However, even with a pn junction diode produced by the above-mentioned CVD process, damage is caused by plasma on the outer surface of a semiconductor substrate which yields a defect level at the interface between the substrate and a film built up thereon. As a result, the defect level allows electrons to run through the interface when an reverse bias voltage is applied to the diode, causing recombination of electrons so as to produce a higher dark current.

In order to reduce the above-mentioned damage by plasma, it has been proposed that an amorphous silicon carbide film is built up on a silicon single crystal substrate by a relatively low RF power at a temperature of about 200 to 300 deg. C. However, this process has disadvantages in the manufacture thereof since a relative long time is required for forming the amorphous silicon carbide film on the substrate.

SUMMARY OF THE INVENTION

In view of the above-mentioned disadvantages of the conventional heterostructure elements, the present invention is devised.

Accordingly, a first object of the present invention is to provide a process of producing a heterostructure diode in which a damage on the outer surface of a substrate is cured while reducing the time required of forming an amorphous silicon carbide on a silicon single crystal substrate due to lowering of the speed of deposition of the amorphous silicon carbide on the substrate.

Further, a second object of the present invention is to provide an apparatus for detecting radiation such as light rays, radioactive rays and the like, in which heterostructure elements produced by the above-mentioned process according to the present invention are used.

To the end, according to the first aspect of that present invention, there is provided a process of producing a heterostructure diode, comprising the steps of forming an amorphous semiconductor film containing hydrogen including active hydrogen on a silicon single crystal substrate by use of a plasma CVD process so as to form a heterostructure lamination having an interface between the silicon single crystal substrate and the amorphous semiconductor film, forming electrodes, respectively on both surfaces of the heterostructure lamination; and annealing the heterostructure lamination at a temperature in a range from 100 to 300 deg. C. so as to allow the active hydrogen to cover defects at the interface caused by plasma.

According to one specific form of the first aspect of the present invention, there is provided a process of producing a heterostructure diode by a plasma CVD method, including the steps of forming a thin first amorphous semiconductor film containing hydrogen on a silicon single crystal substrate with a relatively low RF power at a temperature of about 200 deg. C. to 300 deg. C. so as to form a primary lamination having an interface between the first semiconductor film and the silicon single crystal substrate, forming a second amorphous semiconductor film over the first amorphous semiconductor film at a temperature of about 200 deg. C. to 300 deg. C. with a relative high RF power so as to form a heterostructure lamination, forming electrodes on both surfaces of the lamination so as to form a heterostructure diode, and annealing the diode at a temperature in a range 100 to 300 deg. C. so as to cause active hydrogen in the first thin semiconductor film to cover a damage at the interface.

In the above-mentioned process in the specific form of the present invention, the process of forming the amorphous silicon carbide films can be extended to a process in which a number n of amorphous silicon carbide films can be formed on the silicon single crystal substrate by increasing the applied RF power successively in n stages.

The present invention will be explained in more detail in the following description in connection with the accompanying drawings, with respect to embodiments of the present invention, in which:

BRIEF DESCRIPTION OF THE DRAWINGS

FIGS. 5a through 5c are views illustrating a process of producing a heterostructure diode in a second embodiment form of the present invention;

FIG. 6 is a graph showing an I-V characteristic of a heterostructure diode using an amorphous silicon carbide film, produced by the process in the second embodiment form of the present invention;

DETAILED DESCRIPTION OF THE INVENTION

FIGS. 1a through 1d show a process of producing a heterostruoture diode in a first embodiment of the first aspect of the present invention.

Figure 1A:
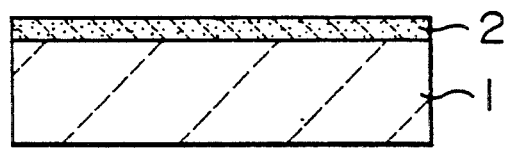
FIGS. 1a to 1d are views illustrating a process of producing a heterostructure diode in a first embodiment form of the first aspect of the present invention.
Figure 1B:
Figure 1C:
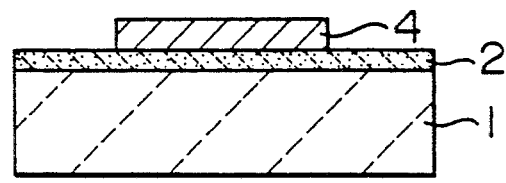
Figure 1D:
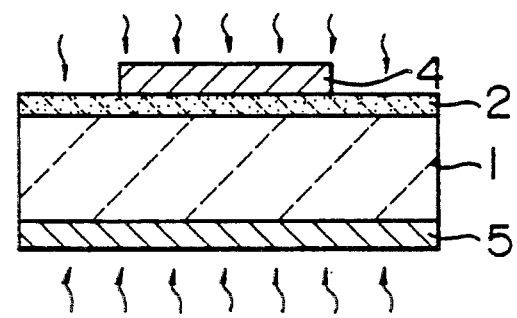

At first, an amorphous silicon carbide film 2 is formed all over the upper surface of a silicon single crystal substrate 1 (P type, 10 kΩ) so as to form a heterostructure lamination, and then electrodes 4, 5 are formed on both sides of the heterostructure lamination so as to obtain a heterostructure diode with the use of a parallel plate type plasma CVD device (FIG. 1a). The thus obtained diode is annealed at a relatively low temperature of about 100 to 300 deg. C.

REFERENCE EXAMPLE 1

Using a parallel plate type plasma CVD device, an amorphous silicon carbide was formed on a silicon single crystal substrate (P type, 10 kΩ) in the following condition:
Substrate Temperature: 200 deg. C.
Gas used: Monosilane (100%), methane (100%)
Gas Flow Rate: Monosilane 70 sccm Methane 30 sccm
Gas Pressure: 0.6 torr
Film Thickness: 100 to 200 nm
RF Power: 30 W (42 mW/cm²)

Then, an aluminum electrode having a thickness of about 300 nm was formed on the build-up amorphous silicon carbide film by a resistive heating evaporation device with the use of a metal mask 3.

Further, an aluminum electrode having a thickness of about 300 nm was formed all over the rear surface of the silicon single crystal substrate by a resistive heat evaporation device.

Finally, by using an electrical furnace the thus produced heterostructure diode was annealed in the following condition:
Atmospheric Gas: Nitrogen
Temperature: 230 deg. C.
Time: 30 to 90 min.

Figure 2:
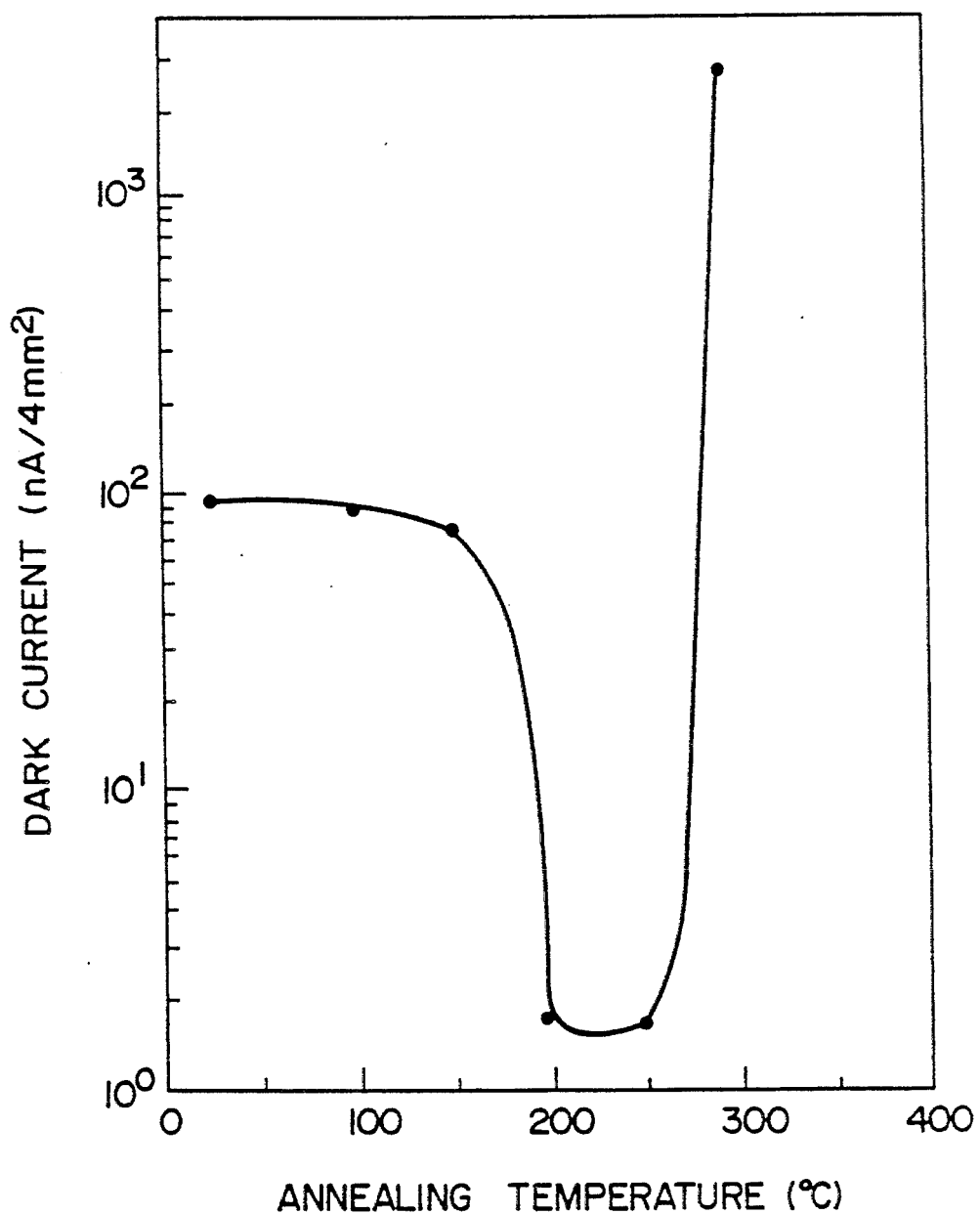
FIG. 2 is a graph showing a dependency of dark current upon annealing temperature under application of reverse bias voltage.

The annealing temperature was determined from data of dependency of dark current upon anneal temperature under a reverse bias condition applied to the heterostructure diode as shown in FIG. 2 which shows in the case of an annealing time of one hour. From the data, it is found that an annealing temperature from 200 to 250 deg. C. can give a lowest dark current. It is noted that an annealing temperature of higher than 100 deg. C. can exhibit the effect of the present invention.

Figure 3:
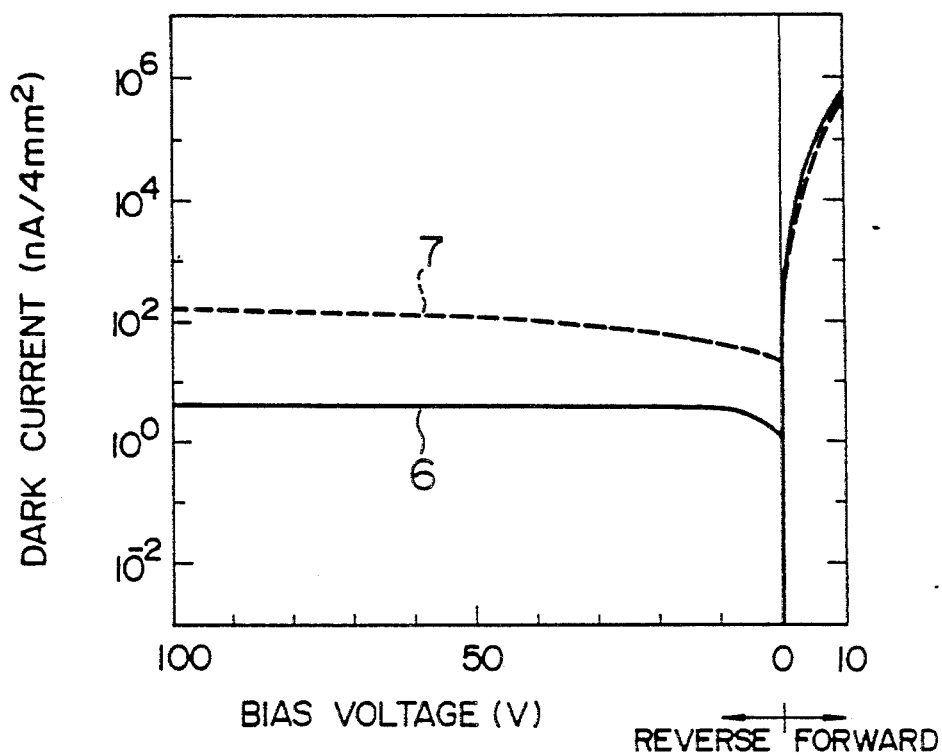
FIG. 3 is a graph showing an I-V characteristic of the heterostructure diode produced by the process in the first embodiment form.

FIG. 3 shows the I-V characteristics of heterostructure diodes. In this figure, reference numeral 6 denotes the heterostructure diode produced by the process in the first embodiment while reference numeral 7 denotes a heterostructure diode produced in a conventional process in which no annealing treatment was carried out. From this figure, it is found that the dark current is reduced by one or second order by the process in the first embodiment form.

It is noted that the anneal treatment according to the present invention can be performed also before the build-up of the amorphous silicon carbide film.

Figure 4:
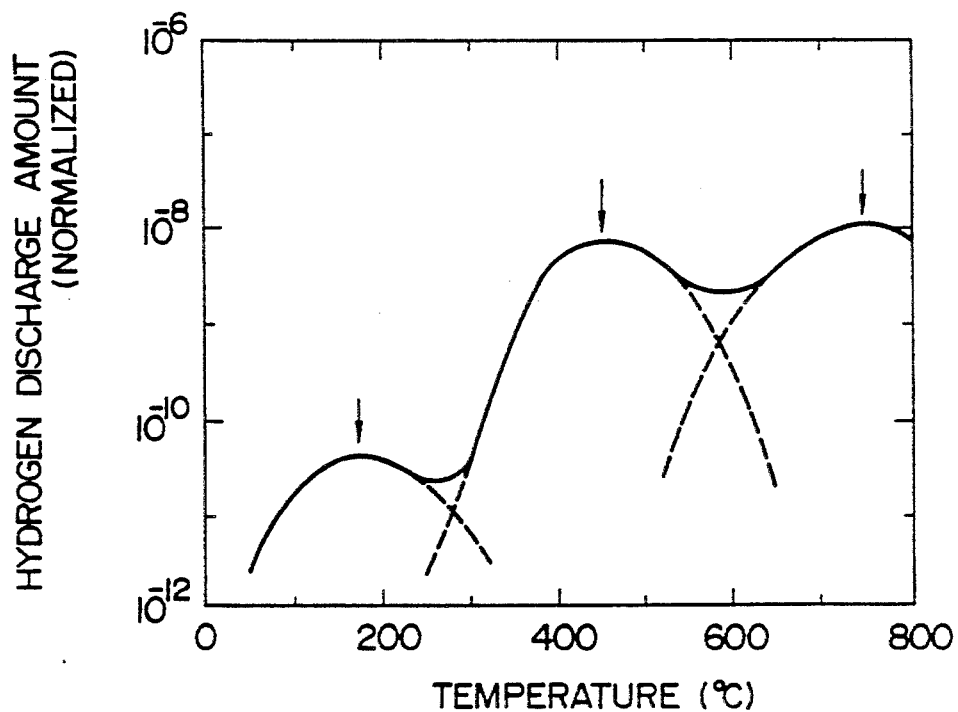
FIG. 4 is a graph showing a result of thermal desorption of hydrogen.

The reason why the dark current can be reduced was ascertained by measuring the thermal desorption of hydrogen from the amorphous silicon carbide film in the heterostructure diode produced by the process in the first embodiment form. FIG. 4 shows a result of the measurement at a temperature rising rate of 20 deg. C./min. From this figure, it is found that a discharge curve has three peaks. It is considered that, of these peaks, the one having the lowest temperature (about 180 deg. C.) exhibits a discharge of active hydrogen which is contained in the amorphous silicon carbide film and which is out of a bonded condition while the other two (about 450 deg. C. and about 750 deg. C.) exhibit discharges of hydrogen in a bonded condition within the amorphous silicon carbide film. From this fact, the effect of the annealing treatment will be explained below in reference to FIG. 2. With the annealing treatment at a temperature up to 200 deg. C. for a relatively short time of about one hour, active hydrogen out of a bonded condition within the amorphous silicon carbide film cannot cover sufficiently defects in the silicon single crystal substrate due to damage by plasma, and accordingly, the dark current is unaltered from a condition before the annealing treatment. However, with the annealing treatment at a temperature of 200 to 300 deg. C., active hydrogen can sufficiently cover defects in the silicon crystal substrate due to damage by plasma, and accordingly, the dark current caused by recombination which occurs through a defect level at the interface can be reduced. However, with the annealing temperature at a temperature above 300 deg. C., hydrogen in a bonded condition is discharged resulting in occurrence of dangling bonds in the film, and accordingly, the dark current is increased.

FIGS. 5a through 5c show a process of producing a heterostructure diode in a second embodiment of the first aspect of the present invention.

A thin first amorphous semiconductor film 22 is formed on a silicon single crystal substrate (P type, 10 kΩ) 21 with a relative low RF power at a temperature of 200 deg C. to 300 deg. C. so as to form a primary heterostructure lamination with the use of a parallel plate type plasma CVD device. Then a second amorphous semiconductor film 23 is then formed on the first amorphous silicon carbide film 22 with a relative high RF power at a temperature from 200 deg. C. to 300 deg. C. so as to obtain a heterostructure lamination. Then, electrodes 24 are formed on both surfaces of the thus obtained lamination.

REFERENCE EXAMPLE 2

A heterostructure lamination of a thin first amorphous silicon carbide was formed on a silicon single crystal substrate (P type, 10 kΩ) in the following condition:
Substrate Temperature: 200 deg. C.
Gas used: Monosilane (100%), Methane (100%)
Gas Flow Rate: Monosilane 70 sccm Methane 30 sccm
Gas Pressure: 0.6 torr
RF Power: 5 W (7 mW/cm$^2$)
Film Deposition Speed: 3 nm/min
Film Thickness: 5 nm Then a second amorphous carbide film was formed all over the top surface of the first amorphous silicon carbide film in the following condition:
Substrate Temperature: 200 deg. C.
Gas used: Monosilane (100%), Methane (100%)
Gas Flow Rate: Monosilane 70 sccm Methane 30 sccm
Gas Pressure: 0.6 torr
RF Power: 30 W (42 mW/cm$^2$)
Film Deposition Speed: 11.5 nm/min
Film thickness: 150 nm Aluminum electrodes having a thickness of 300 nm were formed on both surface of the final lamination so as to obtain a heterostructure diode with the use of a resistive heat evaporation device. Finally, the heterostructure diode was annealed at a temperature of 200 to 300 deg. C.

COMPARISON EXAMPLE

Figure 8:
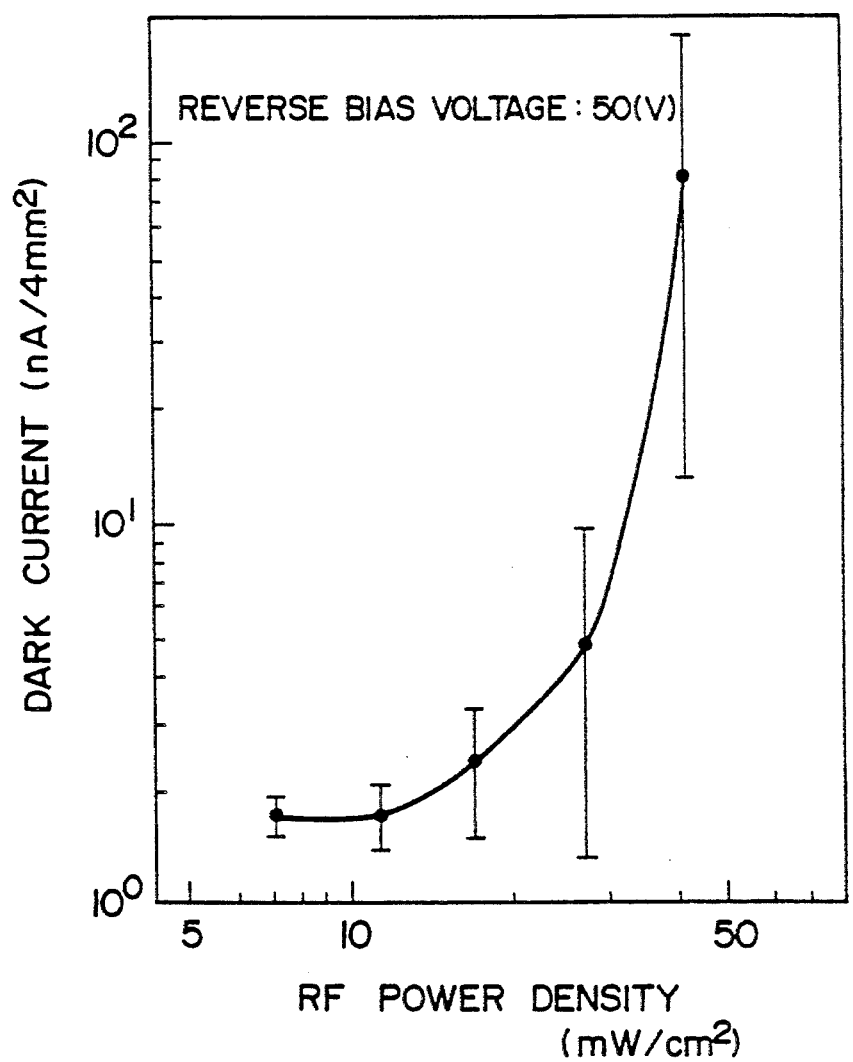
FIG. 8 is a graph showing a dependency of dark current upon RF power under application of reverse bias voltage.
Figure 9:
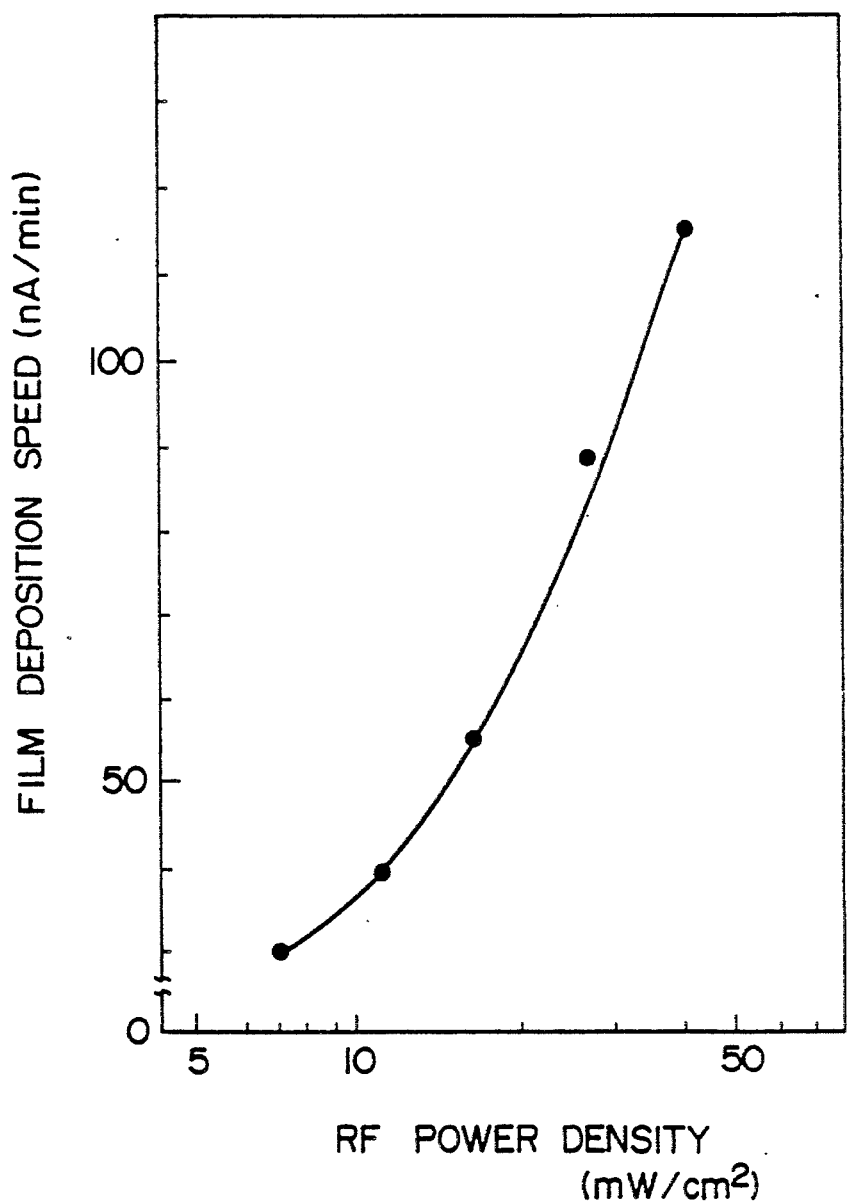
FIG. 9 is a graph showing a dependency of deposition of amorphous silicon carbide upon RF power.

In order to evaluate the effects of the heterostructure diode according to the present invention, a comparison example in which only one amorphous silicon carbide film was laminated on a silicon single crystal substrate was formed in the following condition:
Single Crystal Substrate: P type silicon (10 kΩ)
Substrate Temperature: 200 deg. C.
Gas used: Monosilane (100%), Methane (100%)
Gas Flow Rate: Monosilane 70 sccm Methane 30 sccm
Gas Pressure: 0.6 torr
RF Power: 30 W
Film Thickness: 150 nm FIGS. 8 and 9 show a dependency of dark current upon RF power under application of a reverse bias voltage, and a dependency of film deposition speed upon RF power, respectively. From these figures, it is found that in the case of a low RF power below 11 mW/cm$^2$, a heterostructure diode having a low dark current can be stably produced. However, the film deposition speed is as low as ¼ to ⅓ of a film deposition speed which can be obtained by the application of a high RF power of 40 mW/cm$^2$, and further, the aging effect thereof becomes larger so as to give a problem of lower reliability.

FIG. 6 shows I-V characteristics of heterostructure diodes in which reference numeral denotes 25 the characteristic of the diode in the second embodiment while reference numeral 26 denotes that of the comparative example. The dark current of the heterostructure diode in the reference example 2 can be reduced by the order of 1 to 2 in comparison with that of the comparison example. Further, the film build-up time of the reference example 2 is as short as about ¼ of that is formed with an RF power of 5 W applied throughout the build-up step.

The quality of the films was analyzed with the use of a X-ray photoelectron spectroscopy (ESCA). In the film formed by an RF power of 5 W, the ratio of carbon (C) and silicon (Si) is about 15%. In the film formed by an RF power of 30 W, the ratio was about 25%. This clearly shows that the ratio varies depending upon RF power.

REFERENCE EXAMPLE 3

A thin second amorphous silicon carbide film was formed all over the top surface of a silicon single crystal substrate (P type, 10 kΩ) so as to from a primary heterostructure lamination with the use of a parallel plate type plasma CVD device in the following condition:
Substrate Temperature: 200 deg. C.
Gas used: Monosilane (100%)
Gas Flow Rate: Monosilane 100 sccm
Gas Pressure: 0.6 torr
RF Power: 5 W (7 mW/cm$^2$)
Film Deposition Speed: 3.5 nm/min
Film Thickness: 5 nm Then, a second amorphous silicon carbide film was formed all over the top surface of the first amorphous silicon carbide film in the following condition:
Substrate Temperature: 200 deg. C.
Gas use: Monosilane (100%)
Gas Flow Rate: Monosilane 100 sccm
Gas Pressure: 0.6 torr
RF Power: 30 W (42 mW/cm$^2$)
Film Deposition Speed: 13 nm/min
Film Thickness: 150 nm Finally, aluminum electrodes having a thickness of about 300 nm were formed on both surfaces of the thus obtained lamination with the use of a resistive heat evaporating device.

Figure 7:
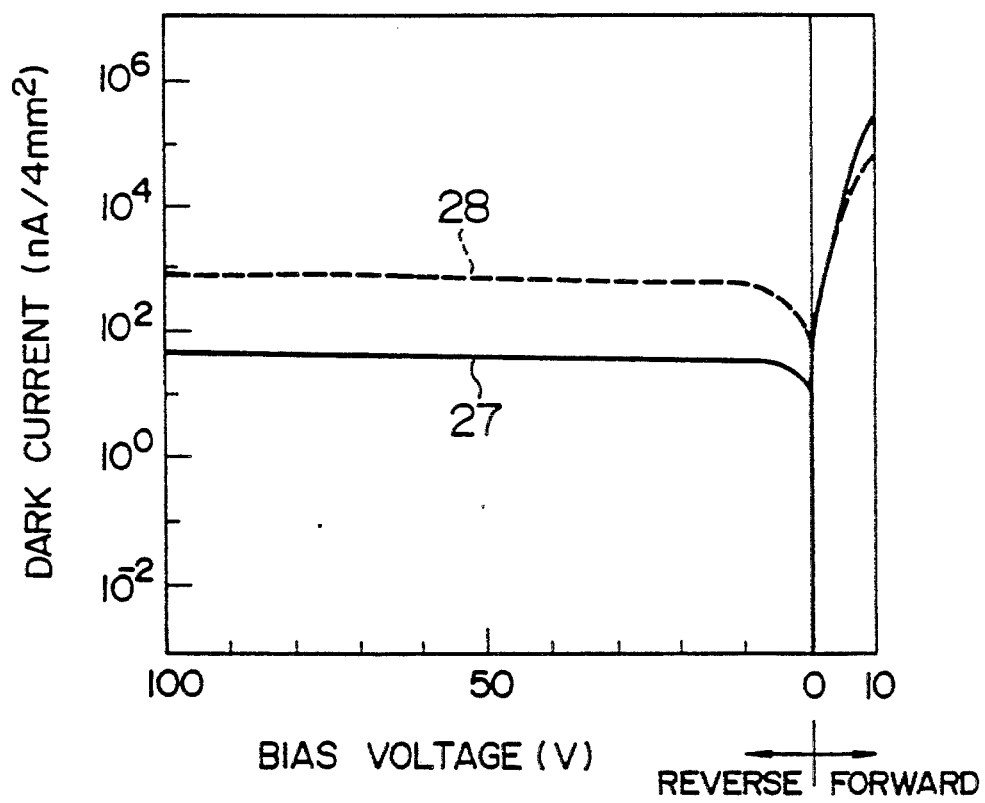
FIG. 7 is a graph showing an I-V characteristic of a heterostructure diode, produced by the process in the second embodiment form of the present invention in a condition different from that of the heterostructure diode shown in FIG. 7.

FIG. 7 shows an I-V characteristic of the heterostructure diode in the reference example 3 denoted by reference numeral 27. The dark current of the reference example 3 is reduced by the order of 2 to 3 in comparison with a heterostructure diode (reference numeral 28) in which an amorphous silicon carbide film is formed with an RF power of 30 W applied throughout a deposition step. Meanwhile the film build-up time of the reference example 3 is as short as about ¼ of that formed with an RF power of 5 W applied throughout the deposition step.

Incidentally, the change-over of RF power is preferably made in such a way that a lower RF power is changed over at a value below 15 mW while a high RF power is changed over at a value above 15 mW.

In the above-mentioned process in the second embodiment form, a thin first amorphous semiconductor film is formed on a crystal substrate with a lower RF power up to a thickness which ca prevent the substrate from being affected by plasma so as to lower the dark current upon application of a reverse bias voltage, and thereafter, a second amorphous semiconductor film is formed on the first amorphous semiconductor film with a high RF power so as to shorten the required film build-up time.

The second aspect of the present invention will be described hereinbelow in first and second embodiment forms with reference to FIGS. 10 and 11.

Hitherto, when a radiation detecting apparatus is composed of a plurality of semiconductor radiation detectors, these radiation detectors are constructed as separate units and then combined. For instance, when it is desired to measure β and γ rays separately in a field where both rays exist commonly, such a radiation detecting apparatus has been used as having two separate semiconductor radiation detectors having the same sensitivity level to γ ray. In addition, one of the two radiation detectors has sensitivity only to the γ ray, while the other is sensitive both to β and γ rays. The sensitivity to the β ray is therefore determined by subtracting the output of one of the radiation detector from the output of the other radiation detector. In case of a survey meter or an area monitor which is used for monitoring environment against radiation, it is required to accurately measure the dose rate (βSv/hr) over a wide range. To meet such a demand, it has been a common measure to use a radiation detecting apparatus which is composed of a pair of radiation detectors constructed as separate units and having different sensitivity levels. In operation, when the dose rate is rather small, the radiation detector having higher sensitivity operates, whereas, when the dose rate is large, the detector having lower sensitivity is used to avoid saturation in the measuring circuit.

These known radiation detecting apparatus, however, suffer from the following disadvantages. Namely, the size of the detecting apparatus is large due to the use of two separate detector units. In case of the radiation detecting apparatus for separately detecting the radiation rays, the detecting accuracy tends to be degraded due to difference in the sensitivity between two separate detectors.

It is therefore another major object of the present invention to provide a radiation detecting apparatus which is capable of overcoming the above-described problems.

To this end, according to the second aspect of the present invention, there is provided a semiconductor radiation detecting apparatus comprising: a single crystal semiconductor substrate; an amorphous semiconductor layer deposited on the substrate; and at least two metal electrodes formed on the amorphous semiconductor layer and a metal electrode provided on the surface of the substrate where the semiconductor layer is not deposited; whereby at least two independent radiation detectors having radiation-sensitive depletion regions spreading in the single crystal semiconductor substrate under the at least two electrodes are formed on the single crystal semiconductor substrate.

The semiconductor detecting apparatus of the present invention can have a compact design because of integration of the detecting section which is made possible by of the detecting section which is made possible by formation of a plurality of detectors on a common single crystal semiconductor substrate. When the apparatus is used for the purpose of separate detection of radiation rays, the accuracy of separate detection of radiation rays is improved thanks to the fact that two detectors used in the detection are formed under the same condition and, hence, exhibit the same level of sensitivity.

EXAMPLE 1

Figure 10:
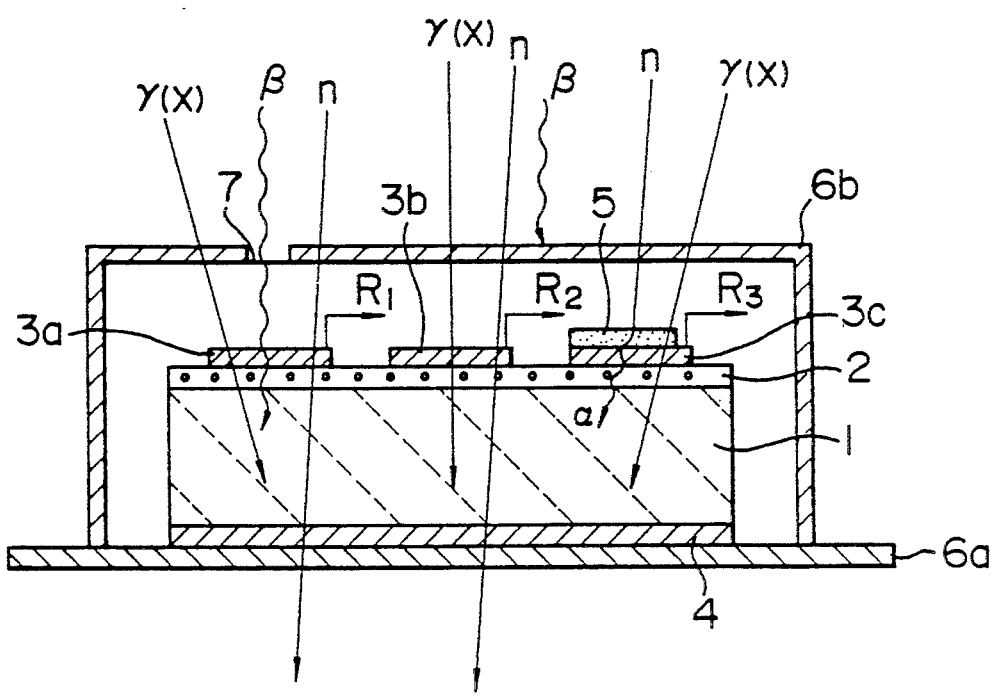
FIG. 10 is a cross-sectional view illustrating an individual radiation measuring type semiconductor detector in a first embodiment form of the second aspect of the present invention.

FIG. 10 is a sectional view of a separation measurement type semiconductor radiation detecting apparatus for separately detecting γ (X) ray, β ray and neutron ray. This semiconductor radiation detecting apparatus employs a single crystal semiconductor substrate which is, in this case, a silicon single crystal substrate (P type, 10 kΩcm) denoted by 1. An amorphous silicon carbide layer 2 is formed over the entire surface of the silicon single crystal substrate 1 by means of a parallel planar plasma CVD device, under the following conditions.

Substrate Temperature: 200 deg. C.
Gas used: Monosilane (100%) Methane (100%)
Gas Flow Rate: Monosilane 70 SCCM Methane 30 SCCM
Gas Pressure: 0.6 Torr
Film Thickness: 150 nm
RF power: 12 W Subsequently, three aluminum electrodes 3a, 3b and 3c of the same area are formed to have a thickness of about 300 nm on the silicon carbide layer 2 by resistance-heating evaporation device using a metal mask, whereby a heterostructure lamination is obtained. Then, an aluminum electrode 4 is formed to a thickness of about 300 nm by vacuum evaporation over the entire area of the surface where the amorphous silicon carbide layer is not formed. Then, an amorphous BN layer 5 containing 10B at a high density is formed by a parallel planar plasma CVD device under the following conditions on the aluminum electrode 3c leaving a portion for deriving a lead line, whereby three heterostructure diodes are formed.

Substrate temperature: 300° C. or lower
Gas used: $B_2H_6$ (10B 70% or higher, diluted by hydrogen) $N_2$
Gas pressure: 0.6 Torr
Film thickness: 500 nm
RF power: 50 W Subsequently, the three heterostructure diodes are mounted on the stem 6a of the package using a silver paste, and leads wires are connected to these heterostructure diodes so as to enable signals $R_1$, $R_2$, $R_3$ from these three heterostructure diodes to be transmitted to pre-amplifier circuits. Finally, a cover 6b of the package, made of Fe and having a thickness of about 200 μm) is attached. It is to be noted that a polyethylene film 7 with aluminum evaporation-deposited to a thickness of about 30 μm is attached only to the aluminum electrode 3a for detecting β ray, for the purpose of shielding light. A radiation detecting apparatus having three semiconductor detectors is thus obtained.

In use, reverse bias voltages are simultaneously applied to these semiconductor detectors. The signals produced in response to the γ (X) ray, β ray and neutron ray when the detecting apparatus is used in a field where these rays simultaneously exist are represented by Sγ, Sβ and Sn, respectively. The following relationships exist between the outputs $R_1$, $R_2$ and $R_3$ from the respective diodes and the signals produced in response to the respective rays.

$$R_1 = S\gamma + S\beta \quad (1)$$

$$R_2 = S\gamma \quad (2)$$

$$R_3 = S\gamma + Sn \quad (3)$$

Namely, the three heterostructure diodes exhibit the same level of sensitivity to γ (X) ray which has a long range, because these diodes have the same size of depletion layer which is the radiation sensitive region spread in the single crystal substrate for each diode. In case of β ray which has a short range, however, detection is possible only by the detector under the thin incident window. The neutron ray is detected only by the detector covered by the BN layer, through sensing the α ray discharged as a result of 10B (n,α) reaction.

From the formulae (1) to (3), the signals corresponding to the γ (X) ray, β ray and neutron ray are respectively represented as follows.

$$S_\gamma = R_2 \quad (4)$$

$$S_\beta = R_1 - R_2 \quad (5)$$

$$S_n = R_3 - R_2 \quad (6)$$

Thus, according to the invention, it is possible to integrate the detecting sections because three semiconductor detectors are formed on the same single crystal semiconductor substrates. In addition, since three semiconductor radiation detectors exhibit the same level of sensitivity to γ (X) ray, it is possible to obtain an improved separated measuring accuracies for the γ (X) ray, β ray and neutron ray.

This embodiment may be modified such that cadmium telluride or gallium arsenide is used as the material of the single crystal semiconductor substrate or that amorphous silicon is used as the amorphous semiconductor layer.

EXAMPLE 2

Figure 11:
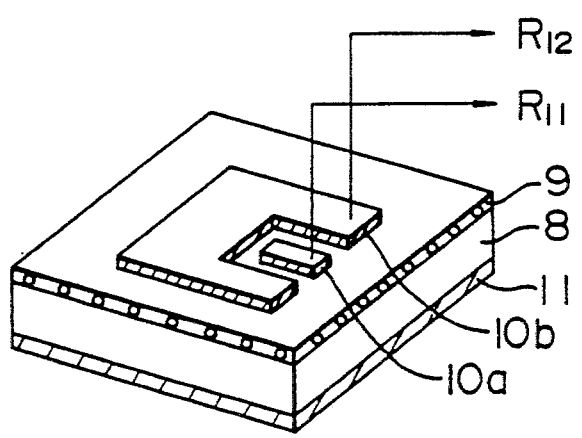
FIG. 11 is a perspective view illustrating an individual radiation measuring type semiconductor detector in a second embodiment of the second aspect of the present invention.

FIG. 11 is a perspective view of a semiconductor radiation detecting used as a survey meter for detecting γ (X) ray. This semiconductor radiation detecting apparatus employs a single crystal semiconductor substrate which is, in this case, a silicon single crystal substrate (P type, 10 kΩcm) denoted by 8. An amorphous silicon carbide layer 9 is formed over the entire surface of the silicon single crystal substrate 8 by means of a parallel planar plasma CVD device, under the following conditions.
Substrate temperature: 200° C.
Gas used: Monosilane (100%)
Gas flow rates: 100 SCCM
Gas pressure: 0.6 Torr
Film thickness: 1 μm
RF power: 12W Subsequently, two aluminum electrodes 10a (small area) and 10b (large area) are formed to have a thickness of about 300 nm on the silicon carbide layer 2 by resistance-heating evaporation device using a metal mask, whereby a heterostructure lamination is obtained. Then, an aluminum electrode 11 is formed to a thickness of about 300 nm by resistance heating evaporation device over the entire area of the surface where the amorphous silicon carbide layer is not formed. The signals $R_{11}$, $R_{12}$ from two heterostructure diodes are selectively used according to the level of the does rate. Namely, the signal $R_{11}$ is adopted when the dose rate of γ (X) ray is high, whereas, when the dose rate is low, the signal $R_{12}$ is adopted to obtain higher detection accuracy.

With this semiconductor detecting apparatus, it is possible to obtain a compact survey meter which can detect dose rate of γ (X) ray accurately over a wide range.

This embodiment also may be modified such that cadmium telluride or gallium arsenide is used as the material of the single crystal semiconductor substrate or that amorphous silicon is used as the amorphous semiconductor layer.

As will be understood from the foregoing description, according to the second aspect of the present invention, it is possible to obtain a semiconductor radiation detecting apparatus in which a plurality of semiconductor detectors are formed on the same single crystal semiconductor substrate so as to integrate the detecting section. Since these semiconductor detectors are formed under the same condition, deviation of sensitivity between the semiconductor detectors is reduced so that the accuracy of separate measurement of radiation rays is improved, thus attaining a remarkable practical advantage.

What we claim is:

1. A process of producing a heterostructure diode comprising the steps of:

forming an amorphous silicon carbide film containing hydrogen including active hydrogen on a single crystal substrate by use of a plasma CVD device so as to obtain a heterostructure lamination having an interface between said amorphous silicon carbide film and said single crystal substrate;

forming electrodes respectively on both surfaces on said lamination so as to obtain a heterostructure diode;

annealing said heterostructure diode so as to allow said active hydrogen to cover defects of said interface at a temperature in a range from 100 to 300 deg. C.

2. A process of producing a heterostructure diode comprising the steps of:

forming a thin first amorphous semiconductor film containing hydrogen including active hydrogen, on a single crystal substrate with a low RF power by use of a plasma CVD device so as to obtain a first heterostructure lamination having an interface between said first amorphous semiconductor film and said single crystal substrate;

forming an additional amorphous semiconductor film on said first amorphous semiconductor film with an RF power which is higher than said low RF power by use of said plasma CVD device;

repeating said step of forming additional amorphous semiconductor film while successively increasing RF power so as to obtain a lamination having first to n-th semiconductor films laminated one upon another on said single crystal substrate;

forming electrodes on both surfaces of said lamination so as to obtain a heterostructure diode; and annealing said heterostructure diode at a temperature of 100 to 300 deg. C. so as to allow said active hydrogen to cover defects caused by plasma damage at said interface.

3. A process as set forth in claim 2, wherein a silicon single crystal substrate is used as said silicon single crystal substrate, and amorphous silicon carbide films are used as said first and additional amorphous semiconductor films.

4. A process as set forth in claim 3, wherein said RF power is continuously increased.

5. A process as set forth in claim 3, wherein said low RF power is less than 15 mW/cm$^2$.

* * * * *